United States Patent
Yang et al.

(10) Patent No.: US 10,158,072 B1
(45) Date of Patent: Dec. 18, 2018

(54) STEP HEIGHT REDUCTION OF MEMORY ELEMENT

(71) Applicant: TAIWAN SEMICONDUCTOR MANUFACTURING CO., LTD., Hsinchu (TW)

(72) Inventors: Jen-Sheng Yang, Keelung (TW); Wen-Ting Chu, Kaohsiung (TW); Chih-Yang Chang, Changhua County (TW); Chin-Chieh Yang, New Taipei (TW); Kuo-Chi Tu, Hsinchu (TW); Sheng-Hung Shih, Hsinchu (TW); Yu-Wen Liao, New Taipei (TW); Hsia-Wei Chen, Taipei (TW); I-Ching Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/663,671

(22) Filed: Jul. 28, 2017

Related U.S. Application Data

(60) Provisional application No. 62/512,740, filed on May 31, 2017.

(51) Int. Cl.
| | | |
|---|---|---|
| *H01L 21/00* | (2006.01) | |
| *H01L 23/00* | (2006.01) | |
| *H01L 27/00* | (2006.01) | |
| *H01L 45/00* | (2006.01) | |
| *H01L 27/24* | (2006.01) | |

(Continued)

(52) U.S. Cl.
CPC .... *H01L 45/1675* (2013.01); *H01L 21/76802* (2013.01); *H01L 21/76819* (2013.01); *H01L 21/76837* (2013.01); *H01L 27/2436* (2013.01); *H01L 27/2463* (2013.01); *H01L 45/1233* (2013.01); *H01L 45/1253* (2013.01); *H01L 21/76832* (2013.01); *H01L 21/76835* (2013.01); *H01L 23/5226* (2013.01);

(Continued)

(58) Field of Classification Search
CPC ......... H01L 21/76802; H01L 21/76819; H01L 21/76837; H01L 21/76835; H01L 21/76832; H01L 21/02112; H01L 21/7867; H01L 23/5226; H01L 23/5283; H01L 23/5222; H01L 23/53295; H01L 27/2436; H01L 27/2463; H01L 27/10852; H01L 27/10847; H01L 45/1675; H01L 45/1233; H01L 45/1253; H01L 45/08; H01L 45/145; H01L 45/1616
See application file for complete search history.

(56) References Cited

U.S. PATENT DOCUMENTS

| | | | | |
|---|---|---|---|---|
| 6,916,722 B2 * | 7/2005 | Huang | .................. | H01L 28/60 |
| | | | | 257/306 |
| 8,298,902 B2 * | 10/2012 | Dalton | .............. | H01L 21/76816 |
| | | | | 257/E21.575 |

(Continued)

*Primary Examiner* — Nikolay Yushin
(74) *Attorney, Agent, or Firm* — Maschoff Brennan

(57) ABSTRACT

A semiconductor device includes an inter-metal dielectric layer, a memory cell, a transistor and a dielectric layer. The memory cell includes a metal-insulator-metal (MIM) structure over a top surface of the inter-metal dielectric layer. The transistor underlies the inter-metal dielectric layer. The dielectric layer extends over the transistor and along the top surface of the inter-metal dielectric layer. The dielectric layer is separated from the MIM structure.

20 Claims, 12 Drawing Sheets

(51) Int. Cl.
*H01L 21/768* (2006.01)
*H01L 23/522* (2006.01)
*H01L 23/528* (2006.01)

(52) U.S. Cl.
CPC .......... *H01L 23/5283* (2013.01); *H01L 45/08* (2013.01); *H01L 45/145* (2013.01); *H01L 45/1616* (2013.01)

(56) References Cited

U.S. PATENT DOCUMENTS

| | | | | |
|---|---|---|---|---|
| 8,896,096 | B2* | 11/2014 | Tu | H01L 27/10894 257/532 |
| 2004/0106266 | A1* | 6/2004 | Huang | H01L 28/60 438/393 |
| 2010/0237467 | A1* | 9/2010 | Dalton | H01L 21/76816 257/536 |
| 2014/0021584 | A1* | 1/2014 | Tu | H01L 27/10894 257/532 |

* cited by examiner

STEP HEIGHT REDUCTION OF MEMORY ELEMENT

PRIORITY CLAIM AND CROSS-REFERENCE

This application claims priority to U.S. Provisional Application Ser. No. 62/512,740, filed May 31, 2017, which is herein incorporated by reference.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values. Particularly, RRAM cell includes a resistive material layer, the resistance of which can be adjusted to represent logic "0" or logic "1."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
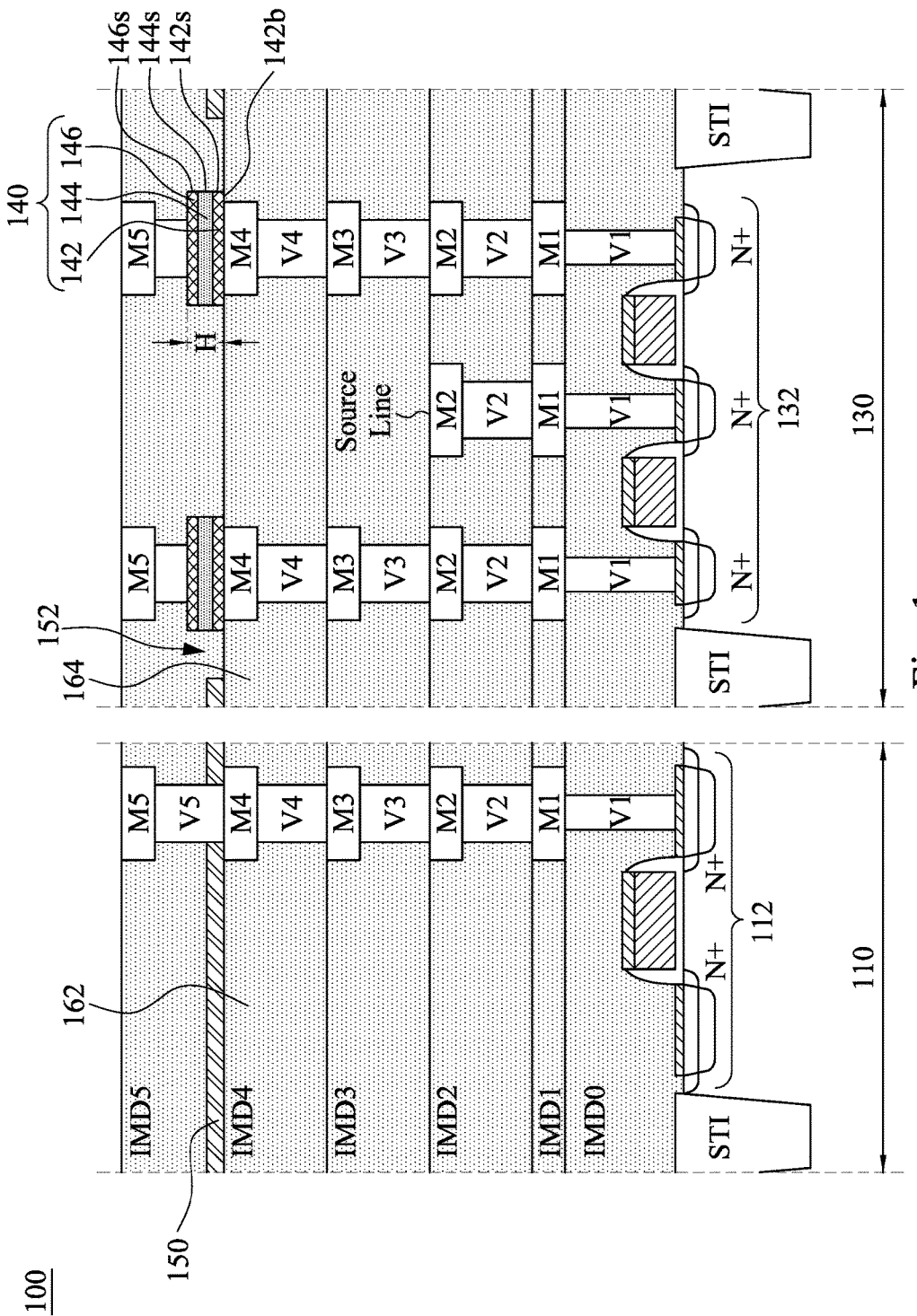
FIG. 1 is a cross-sectional view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a system-on-chip (SOC) 100, which may include a plurality of functional areas fabricated on a single substrate. As depicted in FIG. 1, the SOC 100 includes a logic area 110 and a non-volatile memory (NVM) cell 130. The logic area 110 may include circuitry, such as an exemplary transistor 112, for processing information received from the non-volatile memory cell 130 and for controlling reading and writing functions of the NVM cell 130. In some embodiments, the NVM cell 130 is a resistive random-access memory (RRAM) cell; the RRAM is one of several different types of non-volatile computer memory. While the NVM cell 130 may frequently be referred to herein as an RRAM cell 130, the SOC 100 is not limited to RRAM cells.

An RRAM cell may be used to hold a binary piece of data, or a bit, by altering the properties of an intermediate dielectric layer in memory elements in such a way so as to alter the resistance of the layer. A bit may be encoded by setting the resistance of the dielectric layer to a relatively high resistance state or a relatively low resistance state, with a value of one assigned to one state and a value of zero assigned to the other state. More particularly, an RRAM cell operates under the principle that a dielectric, which is normally insulating, can be made to conduct through a filament or conduction path formed after the application of a sufficiently high voltage. The forming of a filament or conduction path can be referred to as a forming operation or forming process of the RRAM cell. The sufficiently high voltage can be referred to as a 'form' voltage used in the forming operation of the RRAM cell. The 'form' voltage is a different voltage from the voltage used to read and write the RRAM cell. In some embodiments, the 'form' voltage is at a higher absolute value or has a different polarity. During the write operation, the filament or conduction path is broken by passing a voltage different from the 'form' voltage. In some embodiments, the 'write' voltage has a different polarity than the 'form' voltage. A subsequent write operation applies yet a different voltage that is less than the 'form' voltage to reconnect the broken filament. By changing the filament, a high or low resistance is stored in the RRAM cell that does not change when the power is removed. Either the high resistance or the low resistance may be read as a "0" or "1", respectively. During a read operation, a 'read' voltage is applied across the RRAM cell. In some embodiments, the 'read' voltage is much smaller than the 'write' voltage to avoid inadvertent writing of the RRAM cell to a different value.

In some embodiments, the RRAM cell 130 may include metal-insulator-metal (MIM) structures 140 that serve as memory elements of RRAM cell 130. Each MIM structure 140 may include a bottom electrode 142 and top electrode 146, with a dielectric layer 144 in between the two electrodes. The dielectric layer 144 can be referred to as an insulator layer in some cases.

In some embodiments, the bottom electrode 142 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, combinations thereof, or the like. The thickness of the bottom electrode 142 may be between a range about 100-500 nm, 200-400 nm, or 250-350 nm, as examples. If the thickness of the bottom electrode 142 is greater than 500 nm, a step height H of the MIM structure 140 above IMD4 would be undesirably high. If the thickness of the bottom electrode 142 is less than 100 nm, the reset voltage of the RRAM cell would be adversely affected. In some embodiments, the bottom electrode 142 may include one or more layers. For example, the bottom electrode 142 may include a tantalum nitride layer and a titanium nitride layer over the tantalum nitride layer.

The dielectric layer 144 is formed on the bottom electrode 142 and directly contacts to the bottom electrode 142. The thickness of the dielectric layer 144 may be between a range about 20-100 nm, as examples. If the thickness of the dielectric layer 144 is greater than 100 nm, the step height H of the MIM structure 140 above IMD4 would be undesirably high. If the thickness of the dielectric layer 144 is less than 20 nm, the dielectric layer 144 would be susceptible to current leakage. In some embodiments, the dielectric layer 144 may include one or more oxide of W, Ta, Ti, Ni, Co, Hf, Ru, Zr, Zn, Fe, Sn, Al, Cu, Ag, Mo, Cr, other suitable materials, or the like. In some cases, silicon may be included to form a composite material. In some embodiments, hafnium oxide and/or zirconium oxide is used.

The top electrode 146 is formed over the dielectric layer 144. In some embodiments, the top electrode 146 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, combinations thereof, or the like. The thickness of the top electrode 146 may be between a range about 100-500 nm, as examples. If the thickness of the top electrode 146 is greater than 500 nm, the step height H of the MIM structure 140 above IMD4 would be undesirably high. If the thickness of the top electrode 146 is less than 100 nm, the form voltage of the RRAM cell would be adversely affected.

The MIM structures 140 may be fabricated in conjunction with using semiconductor fabrication techniques known to those of skill in the art. Other types of non-volatile computer memory that may be substituted for the RRAM cell in some embodiments of the SOC 100 that include flash memory, ferroelectric RAM, magnetic RAM, phase-change RAM.

Other features depicted in FIG. 1 include shallow-trench isolation (STI) features, and pluralities of metallization layers and vias. As depicted, the SOC 100 is fabricated using five metallization layers, labeled as M1 through M5, with five layers of metallization vias or interconnects, labeled as V1 through V5. Other embodiments may contain more or fewer metallization layers and a corresponding more or fewer number of vias. The RRAM cell 130 includes a full metallization stack connecting the MIM structures 140 to the RRAM transistors 132, and a partial metallization stack connecting a source line to the RRAM transistors 132. The MIM structures 140 are depicted as being fabricated in between the top of the M4 layer and the bottom the M5 layer. The logic area 110 includes a full metallization stack, including a portion of each of metallization layers M1-M5 connected by interconnects V2-V5, with V1 connecting the stack to a source/drain contact of the logic transistor 112.

Also included in SOC 100 is a plurality of inter-metal dielectric (IMD) layers. Six IMD layers, identified as IMD0 through IMD5 are depicted in FIG. 1 as spanning the logic area 110 and the RRAM cell 130. The IMD layers may provide electrical insulation as well as structural support for the various features of the SOC 100 during many fabrication process steps, some of which will be discussed herein. For example, the IMD layers can act as structural support for the MIM structures 140. Specifically, the MIM structures 140 are disposed over a top surface of IMD4. In some embodiments, the IMD layers may be silicon oxide, low-k silicon oxide such as a porous silicon oxide layer, other suitable interlayer dielectric (ILD) material, other suitable intermetal dielectric material, combinations thereof, or the like. In some embodiments, the IMD layers are low-k dielectric layers made from extra low-k materials, extreme low-k materials, combinations thereof, or the like. In some embodiments, IMD layers may have a dielectric constant lower than 2.4. In some embodiments, IMD layers are made using diethoxymethylsilane (mDEOS) or the like as a precursor gas in a chemical vapor deposition (CVD) process. However, other low-k dielectric materials may be used as well.

Also included in the SOC 100 is a first stop layer 150. The first stop layer 150 covers the logic area 110 and thus protects elements in the logic area 110 from fabrication processes of the MIM structures 140. For example, the first stop layer 150 extends over the logic transistor 112 and along the top surface of IMD4, so that elements above the logic transistor 112 can be protected by the first stop layer 150 during fabrication processes of MIM structures 140. In some embodiments, the first stop layer 150 may include dielectric materials, such as silicon carbide, silicon oxynitride, silicon nitride, carbon doped silicon nitride, carbon doped silicon oxide, other suitable dielectric materials, combinations thereof, or the like. The first stop layer 150 can be referred to as a dielectric layer over IMD4 in some embodiments. The first stop layer 150 and the MIM structures 140 have different etch properties. In further embodiments, the first stop layer 150 is selected to have a different etch selectivity than the MIM structures 140. As a result, the first stop layer 150 can protect elements in logic area 110 from one or more etching processes performed to the MIM structures 140.

The first stop layer 150 is separated from the MIM structures 140. For example, the first stop layer 150 is not interposed between MIM structure 140 and IMD4. By using such a configuration, step heights H of MIM structures 140 above IMD4 can be reduced. If MIM structures 140 are formed close to each other, voids would be formed in IMD5 during deposition of IMD5 because the close arrangement of MIM structures 140 causes high aspect ratio of a gap between MIM structures 140, wherein the aspect ratio is a ratio of the height H of MIM structure 140 over a distance between two neighboring MIM structures 140. The aspect ratio of the gap between the MIM structures 140 can be lowered by reducing step heights H of MIM structures 140, and hence the reduction of step heights H of MIM structures 140 may be advantageous for reducing voids in the IMD5.

In some embodiments, the bottom electrodes 142 of MIM structures 140 are in contact with the top surface of IMD4. For example, the bottom electrodes 142 of MIM structures 140 interface IMD4. For example, each bottom electrode 142 shares the same boundary with IMD4. In further embodiments, a material of the first stop layer 150 is absent between the top surface of IMD4 and the bottom electrode 142 of MIM structure 140. Such configurations may be advantageous to reduce the step heights H of MIM structures 140 above IMD4.

In some embodiments, the bottom electrodes 142 of MIM structures 140 are in contact with the M4 layer, and hence the bottom electrodes 142 are electrically connected to the M4 layer. For example, the bottom electrodes 142 of MIM structures 140 interface with the M4 layer. In other words, each bottom electrode 142 shares the same boundary with the M4 layer. In further embodiments, a material of the first stop layer 150 is absent between the top surface of the M4 layer and the bottom electrode 142 of MIM structure 140. Such configurations may be advantageous to reduce the step heights H of MIM structures 140 above IMD4.

In some embodiments, top surfaces of the M4 layer and IMD4 are substantially flush with each other. In some embodiments where the bottom electrode 142 of MIM structure 140 is conformally formed over the top surfaces the M4 layer and IMD4, the bottom electrode 142 may have a bottom surface 142b in contact with top surfaces of the M4 layer and IMD4. The bottom surface 142b has an area greater than an area of the top surface of the M4 layer, so that the bottom surface 142b can be in contact with the M4 layer and IMD4. In further embodiments, if the bottom electrode 142 is formed over the M4 layer and IMD4 that undergo a planarization process, such as a chemical-mechanical polishing (CMP) process, the bottom electrode 142 may be free from a stepped bottom surface. As a result, the step height H of the MIM structure 140 can be reduced. Because the first stop layer 150 does not extend to a position under the bottom electrode 142, a top surface of the bottom electrode 142 may be in a position lower than a top surface of the first stop layer 150 if the bottom electrode 142 is thinner than the first stop layer 150.

In some embodiments, the dielectric layer 144 and the top electrode 146 are conformally formed on the bottom electrode 142. In such embodiments, the MIM structure 140 includes layers of the bottom electrode 142, the dielectric layer 144 and the top electrode 146 stacked in sequence. In some embodiments, since the MIM structure 140 includes a bottom surface in contact with the M4 layer and IMD4 that undergo a planarization process, the MIM structure 140 may be free from a stepped profile, so as to reduce the step height H of the MIM structure 140.

In some embodiments, the stacked bottom electrode 142, the dielectric layer 144 and the top electrode 146 have sidewalls 142s, 144s and 146s. In some embodiments, these sidewalls 142s, 144s and 146s are substantially flush with each other. In some embodiments, the MIM structure 140 may include a stepped or a rough sidewall. In some embodiments, a bottom of the sidewall 142s of the bottom electrode 142 is in contact with the top surface of IMD4.

In some embodiments, the MIM structures 140 are spaced apart from the first stop layer 150 by IMD5. In some embodiments, the first stop layer 150 is absent between the MIM structures 140. For example, the first stop layer 150 defines an opening 152 over the RRAM cell 130, and the MIM structures 140 are disposed within the opening 152.

In some embodiments, IMD4 includes a first portion 162 and a second portion 164. The first portion 162 of IMD4 is in the logic area 110 and covers the logic transistor 112. The second portion 164 of IMD4 is in the RRAM cell 130 and covers the memory cell transistors 132. The first stop layer 150 covers the first portion 162 of IMD4 and does not cover the second portion 164 of IMD4. The MIM structures 140 are disposed over the second portion 164 of IMD4. Since the second portion 164 of IMD4 is free from covered by the first stop layer 150, the first stop layer 150 is absent on the bottom surfaces of the MIM structures 140 over the second portion 164. In some embodiments, because the first stop layer 150 is not between the second portion 164 of IMD4 and the MIM structures 140, the MIM structures 140 are in contact with the second portion 164 of IMD 4, and hence step heights H of the MIM structures 140 can be reduced. In further embodiments, the second portion 164 of IMD4 is in contact with the bottom surface 142b of the bottom electrode 142, and hence the step height H of the MIM structure 140 can be reduced.

Figure 2:
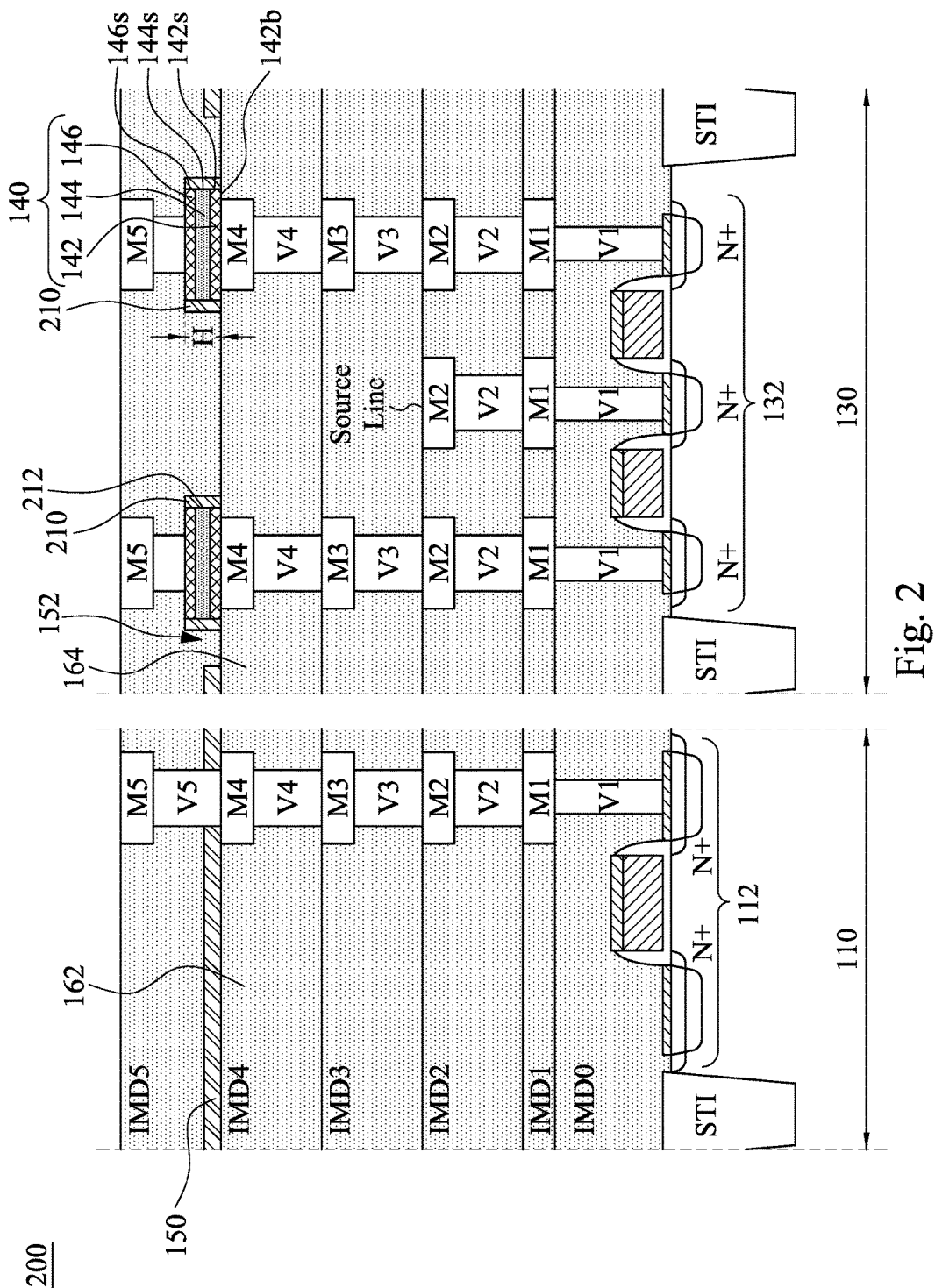
FIG. 2 is a cross-sectional view of a semiconductor device in accordance with some embodiments of the present disclosure.

FIG. 2 illustrates another SOC, SOC 200, which shares some of the features of SOC 100. Specifically, SOC 200 may include a logic area 110 and an RRAM cell 130 substantially as included in SOC 100 and described above. Additionally, SOC 200 includes spacers 210 around corresponding MIM structures 140. The spacer 210 surrounds the MIM structure 140 and covers all sidewalls of the MIM structure 140. For example, the sidewalls 142s, 144s and 146s of bottom electrode 142, dielectric layer 144 and top electrode 146 are covered by the spacer 210. The spacer 210 may include dielectric materials such as silicon nitride, silicon oxynitride, silicon oxide, other suitable dielectric materials, combinations thereof, or the like. The spacers 210 are separated from the first stop layer 150 in some embodiments.

In some embodiments, the spacer 210 has an inner sidewall 212 abutting sidewalls 142s, 144s and 146s of MIM structure 140, wherein the inner sidewall 212 may be stepped, rough or substantially planar. In some embodiments, a bottom of the spacer 210 is in contact with the top surface of IMD4.

Figure 3:
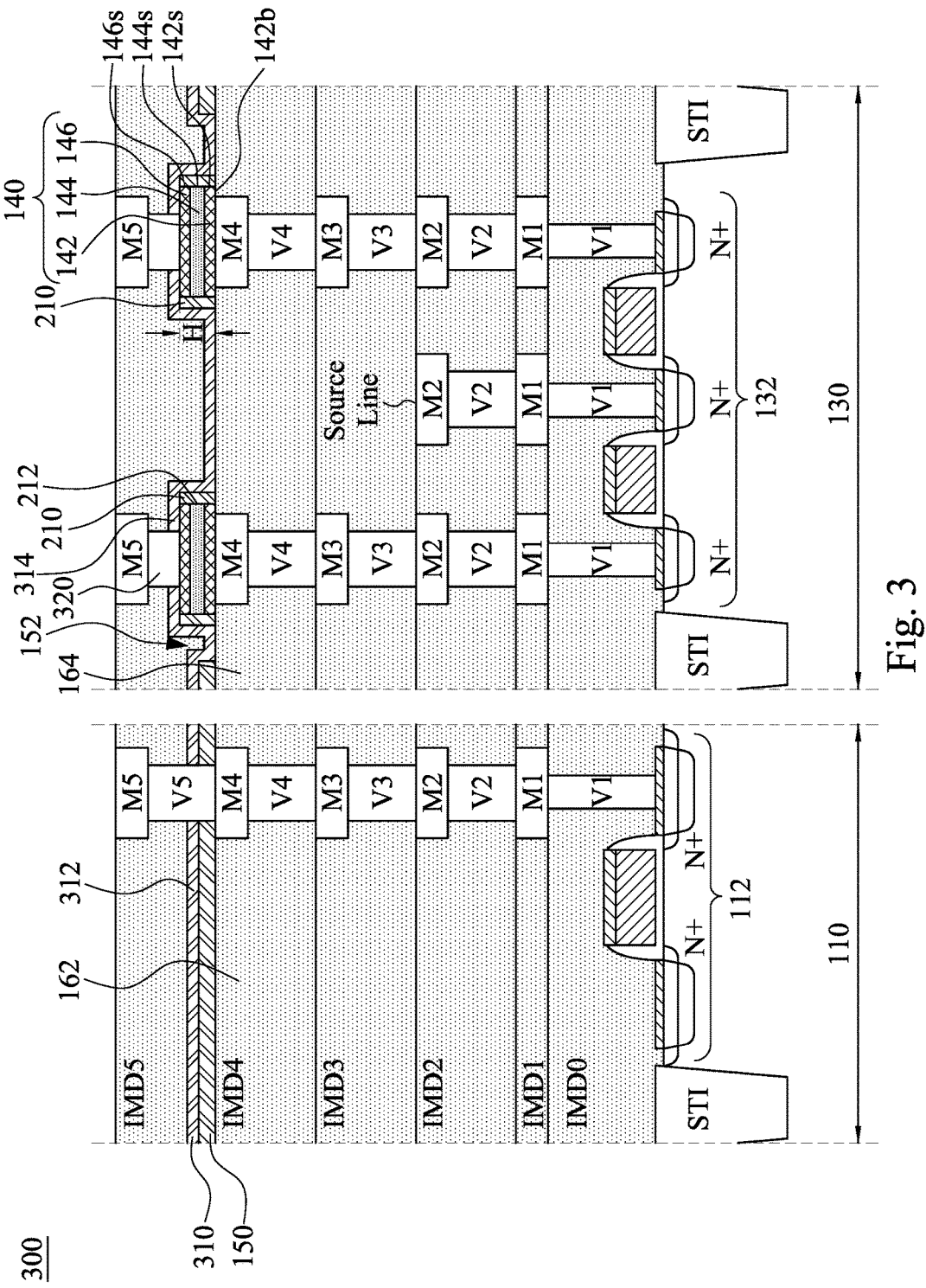
FIG. 3 is a cross-sectional view of a semiconductor device in accordance with some embodiments of the present disclosure.

FIG. 3 illustrates another SOC, SOC 300, which shares many features with the SOC 200. Such shared features include the logic area 110 and the RRAM cell 130. Moreover, as depicted in FIG. 3, the SOC 300 includes a second stop layer 310 spanning the logic area 110 and the RRAM cell 130. For example, the second stop layer 310 includes a first portion 312 in the logic area 110 and a second portion 314 in the RRAM cell 130. The first portion 312 of the second stop layer 310 is disposed over the first stop layer 150. The second portion 314 of the second stop layer 310 covers the spacers 210 and the MIM structures 140. A metal feature 320 extending below the M5 layer electrically connects to the top electrode 146 through the second stop layer 310. In some embodiments, the second stop layer 310 may be the same material as the first stop layer 150. The second stop layer 310 may include, for example, silicon carbide, silicon oxynitride, silicon nitride, carbon doped silicon nitride, carbon doped silicon oxide, other suitable materials, combinations thereof, or the like. The second stop layer 310 and the overlying IMD5 have different etch properties. For example, the second stop layer 310 is selected to have a different etch selectivity than the overlying IMD5.

Figure 4:
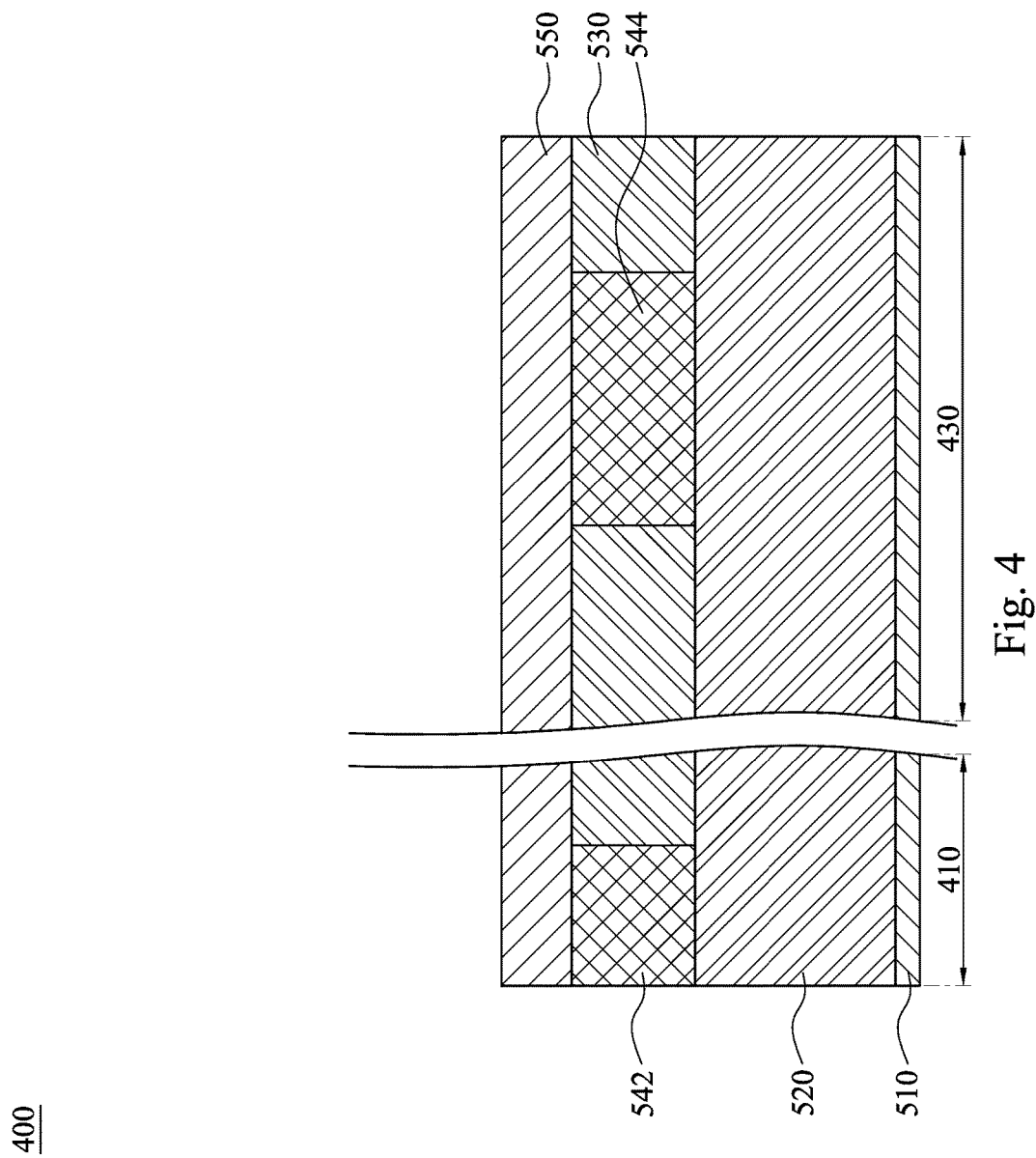
FIGS. 4-12 are cross-sectional views of a semiconductor device in various stages of fabrication in accordance with some embodiments of the present disclosure.

FIGS. 4-12 are cross-sectional representations of an SOC 400, which may be similar in many respects to SOC 300, in various stages of fabrication in accordance with various embodiments of the present disclosure. FIG. 4 depicts a logic area 410 and an NVM cell area 430. In some embodiments where elements of an RRAM cell are to be formed on the NVM cell area 430, the NVM cell area 430 can be referred to as an RRAM cell area as well. Each of these areas includes a portion of a substrate 510 and of an intermediate layer 520. The substrate 510 may be a semiconductor substrate, such as a silicon substrate. Alternatively, the substrate 510 may comprise another elementary semiconductor, such as germanium or the like; a compound semiconductor including silicon carbide or the like; an alloy semiconductor including silicon germanium or the like; combinations thereof, or the like. In some embodiments, the substrate 510 is a semiconductor on insulator (SOI) substrate. The substrate 510 may include doped regions, such as p-wells and n-wells.

The intermediate layer 520 includes a plurality of semiconductor device layers that, for convenience and clarity, are not individually depicted. The plurality of layers depicted as the single intermediate layer 520 may include transistors and contact layers, interconnects between metallization layers, metallization layers, IMD layers, and others. Thus, for example, the intermediate layer 520 includes IMD0-3 and all layers embedded therein as depicted by FIG. 1-3. The SOC 400 cross-section in FIG. 4 also includes a plurality of metal features, such as metal features 542 and 544, embedded in an IMD layer 530. In some embodiments, the IMD layer 530 is IMD4 as depicted in FIGS. 1-3, and the metal features 542 and 544 may be the M4 layer as depicted in FIGS. 1-3.

In some embodiments, after a metal layer deposited over the intermediate layer 520 has been patterned to form the metal features (e.g. metal features 542 and 544) and the IMD layer 530 has been deposited, the SOC 400 undergoes a planarization process, such as chemical-mechanical polishing (CMP) process. After the planarization process, the metal features 542, 544 and the IMD layer 530 may have top surfaces substantially level with each other, as depicted in FIG. 4.

A first stop layer 550 is blanket formed over the IMD layer 530 and the metal features (e.g. metal features 542 and 544) embedded in the IMD layer 530. For example, the first stop layer 550 is deposited over the IMD layer 530 and the metal features embedded in the IMD layer 530 for both the logic area 410 and the RRAM cell area 430. The first stop layer 550 may include silicon carbide, silicon oxynitride, silicon nitride, carbon doped silicon nitride, carbon doped silicon oxide, other suitable materials, combinations thereof, or the like. The first stop layer 550 is selected to have a different etch selectivity than a bottom electrode layer of the RRAM cell formed in a subsequent step. The first stop layer 550 is deposited over the planarized top surfaces of the IMD layer 530 and the metal features 542, 544 using a chemical vapor deposition (CVD) process such as plasma enhanced (PE) CVD, high-density plasma (HDP) CVD, inductively-coupled-plasma (ICP) CVD, thermal CVD, or the like.

Figure 5:
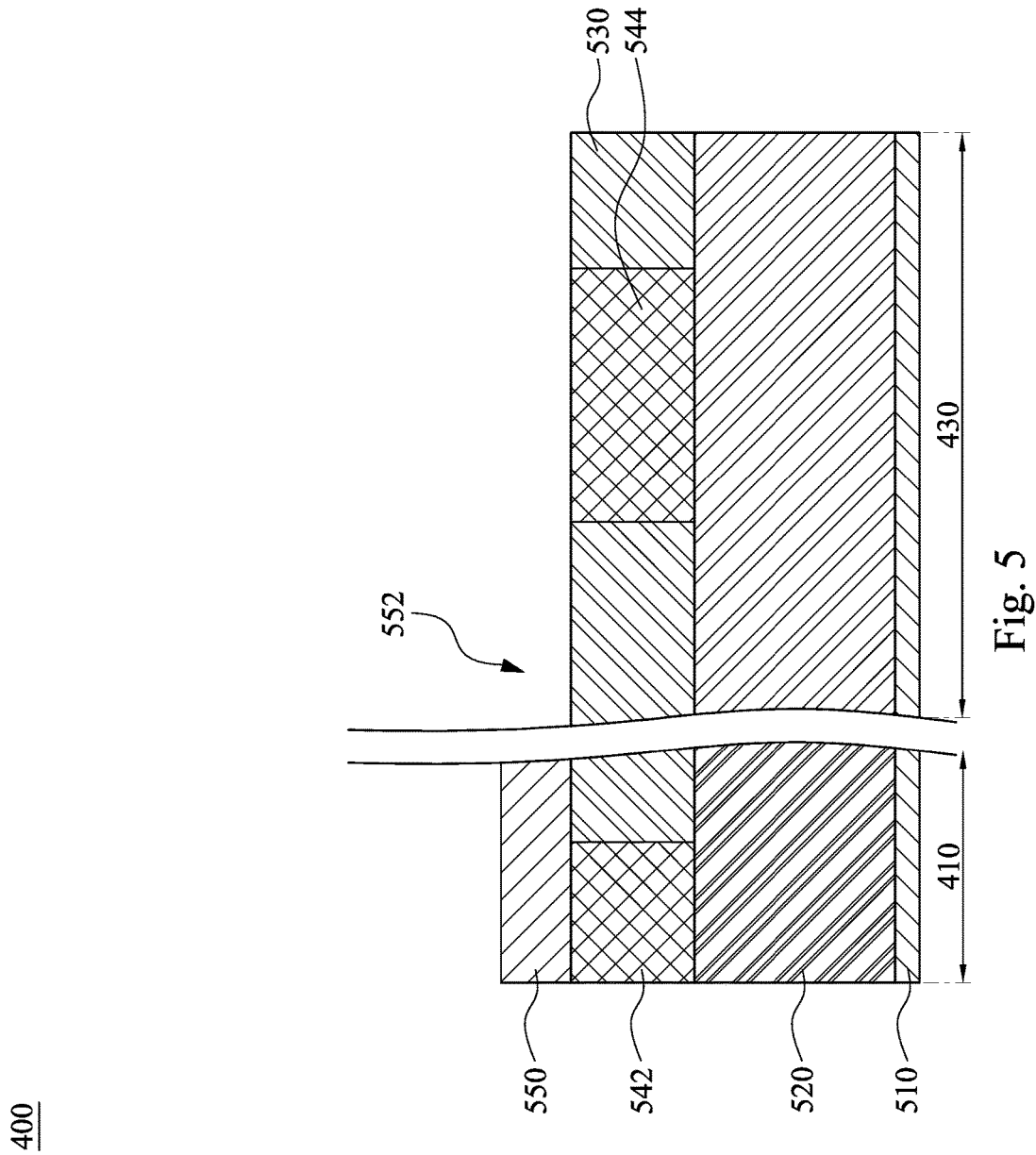

Reference is made to FIG. 5. An opening 552 is patterned in the first stop layer 550 to expose the RRAM cell area 430. For example, a portion of the first stop layer 550 over the inter-metal layer 530 and the metal feature 544 in the RRAM cell area 430 is removed, while leaving another portion of the first stop layer 550 over the logic area 410. For example, after the patterning the first stop layer 550, a portion of the first stop layer over elements in the logic area 410 (e.g. one or more logic transistors) remains. The patterning process includes, for example, depositing a photoresist over the first stop layer 550, exposing a portion of the photoresist to radiation, developing the photoresist, and etching the opening 552 in the first stop layer 550 using the photoresist as an etch mask.

Figure 6:
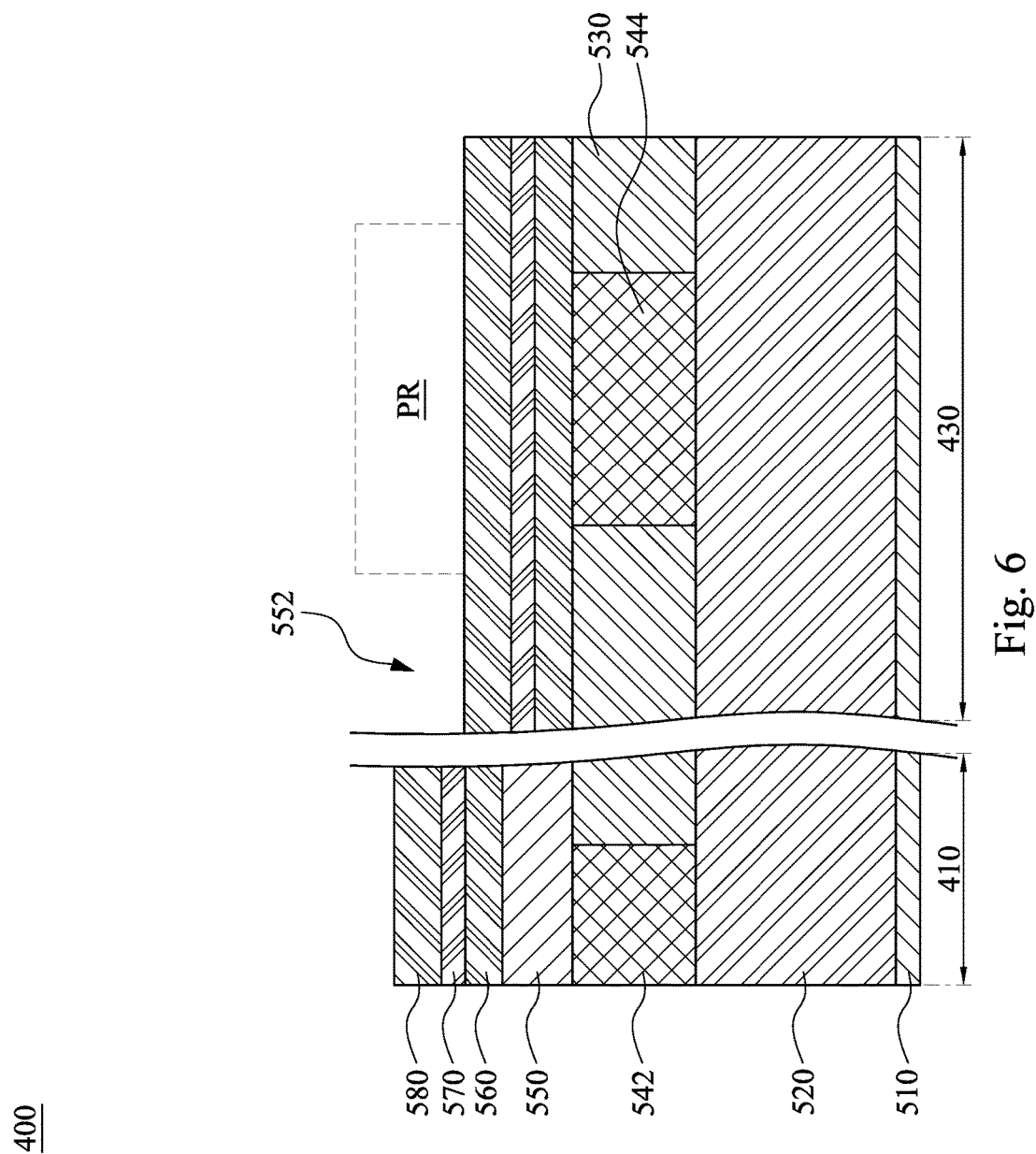

Reference is made to FIG. 6. A bottom electrode layer 560 is blanket formed over the IMD layer 530 and the metal feature 544 in the RRAM cell area 430 and over the first stop layer 550 in the logic area 410. For example, the bottom electrode layer 560 is conformally formed along top surfaces of the IMD layer 530 and the metal feature 544 in the RRAM cell area 430. The bottom electrode layer 560 may include tantalum nitride, titanium nitride, tungsten, copper, other suitable conductors, combinations thereof, or the like. The bottom electrode layer 560 is deposited using a physical vapor deposition (PVD) process, a plating process, or the like. In some cases, a liner or a barrier layer may be deposited first, followed by a deposition of the bulk material using one of the known deposition methods.

Thereafter, a dielectric layer 570 and a top electrode layer 580 are conformally formed over the bottom electrode layer 560 in sequence. The dielectric layer 570 includes a metal oxide, which may be hafnium oxide, zirconium oxide, aluminum oxide, nickel oxide, tantalum oxide, titanium oxide, other oxides, combinations thereof, or the like, used as a resistive material layer. The metal oxide may have a non-stoichiometric oxygen to metal ratio. Depending on the method of deposition, the oxygen to metal ratio and other process conditions may be tuned to achieve specific dielectric layer properties. For example, a set of conditions may yield a low 'form' voltage and another set of conditions may yield a low 'read' voltage. The metal oxide may be deposited. In some embodiments, the metal oxide is a transition metal oxide. In other embodiments, the dielectric layer 570 includes metal oxynitride.

The dielectric layer 570 may be formed by a suitable technique, such as atomic layer deposition (ALD) with a precursor containing a metal and oxygen. Other chemical vapor deposition (CVD) techniques may be used. In other embodiments, the dielectric layer 570 may be formed by a physical vapor deposition (PVD), such as a sputtering process with a metallic target and with a gas supply of oxygen and optionally nitrogen to the PVD chamber. In yet other embodiments, the dielectric layer 570 may be formed using an electron-beam deposition process. The dielectric layer 570 may have a thickness ranging between about 20 angstroms and about 100 angstroms, or between about 40 angstroms and about 100 angstroms. Thicker dielectric layer 570 results in higher 'form' voltage. However, a thin dielectric layer 570 may be susceptible to current leakage if over etched and is more sensitivity to surface and thickness non-uniformity.

Figure 7:
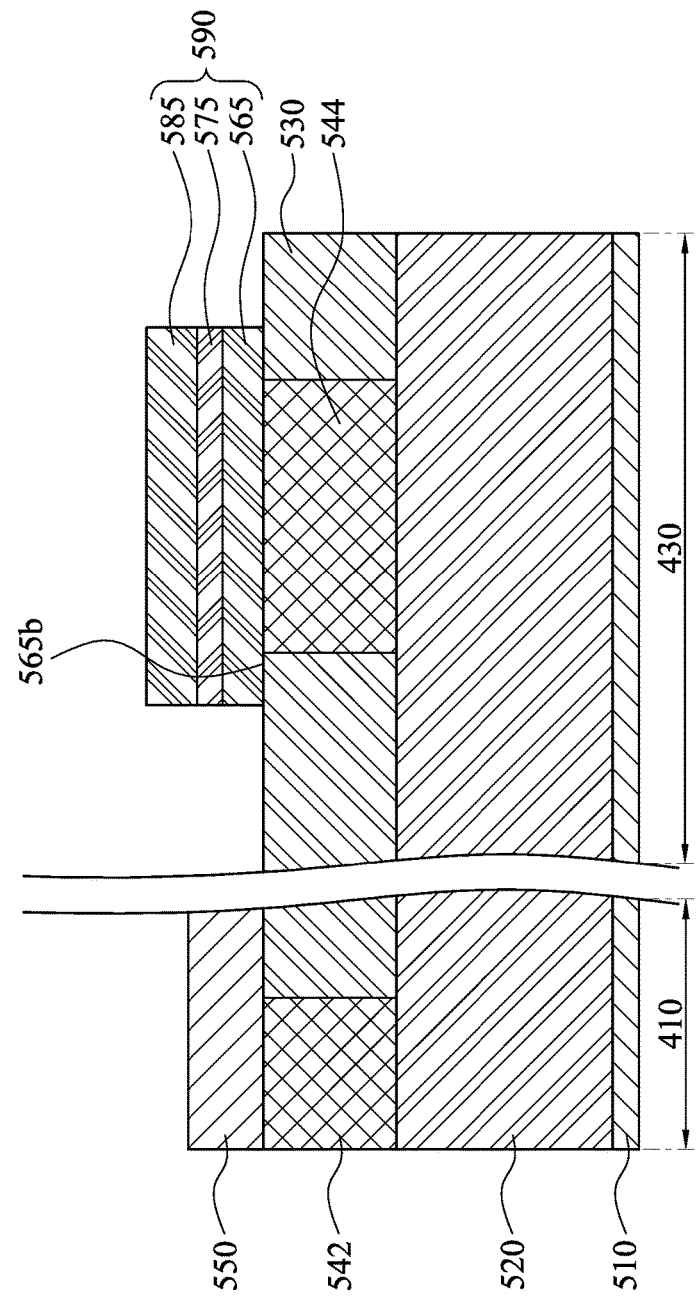

The top electrode layer 580 may be metal, metal-nitride, doped polysilicon, other suitable conductive material, combinations thereof, or the like. For example, the top electrode layer 580 may be tantalum nitride, titanium nitride, platinum, other suitable metal, combinations thereof, or the like. The top electrode layer 580 may be formed by PVD, CVD including ALD, or other suitable technique and has a thickness ranging between about 100 angstrom and about 500 angstroms. If the thickness of the top electrode layer 580 is greater than 500 nm, a step height of a subsequently formed MIM structure 590 (as shown in FIG. 7) would be undesirably high. If the thickness of the top electrode layer 580 is less than 100 nm, the 'form' voltage of the RRAM cell would be adversely affected. Alternatively, the top electrode layer 580 includes other suitable conductive material to electrically connect the device to other portion of an interconnect structure for electrical routing.

In some embodiments, a capping layer is deposited over the dielectric layer 570, and then the top electrode layer 580 is deposited over the capping layer. In various embodiments, the capping layer is a metal, for example, titanium, hathium, platinum, tantalum, other suitable metal, combinations thereof, or the like. The capping layer may be deposited using a PVD process, a CVD, for example, an ALD process. The capping layer may have a thickness ranging between about 20 angstroms and about 150 angstroms. If the thickness of the capping layer is greater than 150 angstroms, a step height of a subsequently formed MIM structure 590 (as shown in FIG. 7) would be undesirably high. If the thickness of the capping layer is less than 20 angstroms, the form voltage of the RRAM cell would be adversely affected.

In some embodiments, the layers are deposited in one system without breaking vacuum. Specifically, one or more of the layers may be deposited in the same chamber or each one in a different chamber on the same vacuum system. In other embodiments, more than one semiconductor processing system is used.

Next, the bottom electrode layer 560, the dielectric layer 570 and the top electrode layer 580 are patterned to form a MIM structure 590, which includes a bottom electrode 565, a dielectric layer 575 and a top electrode 585 stacked in sequence. The resulting structure is shown in FIG. 7. The patterning includes a photolithography operation where a photoresist is deposited, a pattern is defined by exposing photoresist to a radiation, and developing the photoresist to create a photoresist pattern. The photoresist pattern is then used as an etch mask, such as the mask PR as shown in FIG. 6, to protect desired portions of the RRAM cell. As shown in FIGS. 6 and 7, portions of the top electrode layer 580, dielectric layer 570 and bottom electrode layer 560 are removed from the RRAM cell area 430. All of the top electrode layer 580, dielectric layer 570 and bottom electrode layer 560 are removed from the logic area 410. As shown in FIG. 7, the bottom electrode 565, the dielectric layer 575 and the top electrode 585 protected by the mask PR (as shown in FIG. 6) remain over the metal feature 544 and the IMD layer 530. The etch process stops when the first stop layer 550 is reached. Techniques are available to detect the end of etching when a new material layer is reached so as to limit the amount of over etching.

The etch mask PR, protecting desired portions of the top electrode layer 580, dielectric layer 570 and bottom electrode layer 560, has a bottom surface area less than an area defined by the opening 552 of the first stop layer 550. For example, the etch mask PR does not vertically overlap the first stop layer 550. Therefore, the portions of the top electrode layer 580, dielectric layer 570 and bottom electrode layer 560 protected by the etch mask PR do not vertically overlap the first stop layer 550. As a result, after the patterning process, the MIM structure 590 and the underlying structure (i.e. IMD layer 530 and metal feature 544) are free from the first stop layer 550 therebetween. For example, the first stop layer 550 is absent below the MIM structure 590. Therefore, a step height of the MIM structure 590 above the IMD layer 530 is reduced. Specifically, the bottom electrode 565 is directly formed on the planarized surfaces of the IMD layer 530 and the metal feature 544, and the dielectric layer 575 and top electrode 585 are conformally formed on the bottom electrode 565.

Figure 8:
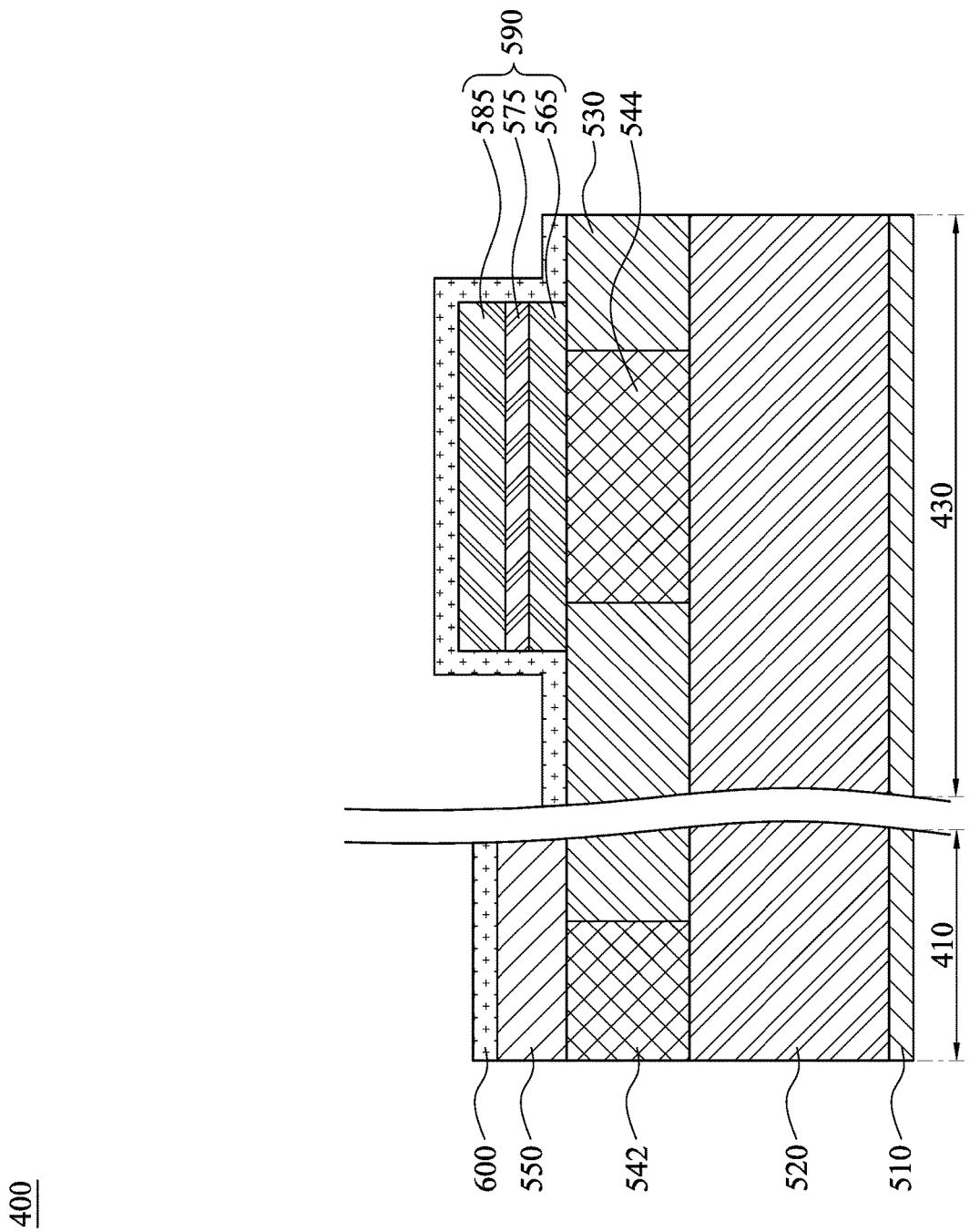
Figure 9:
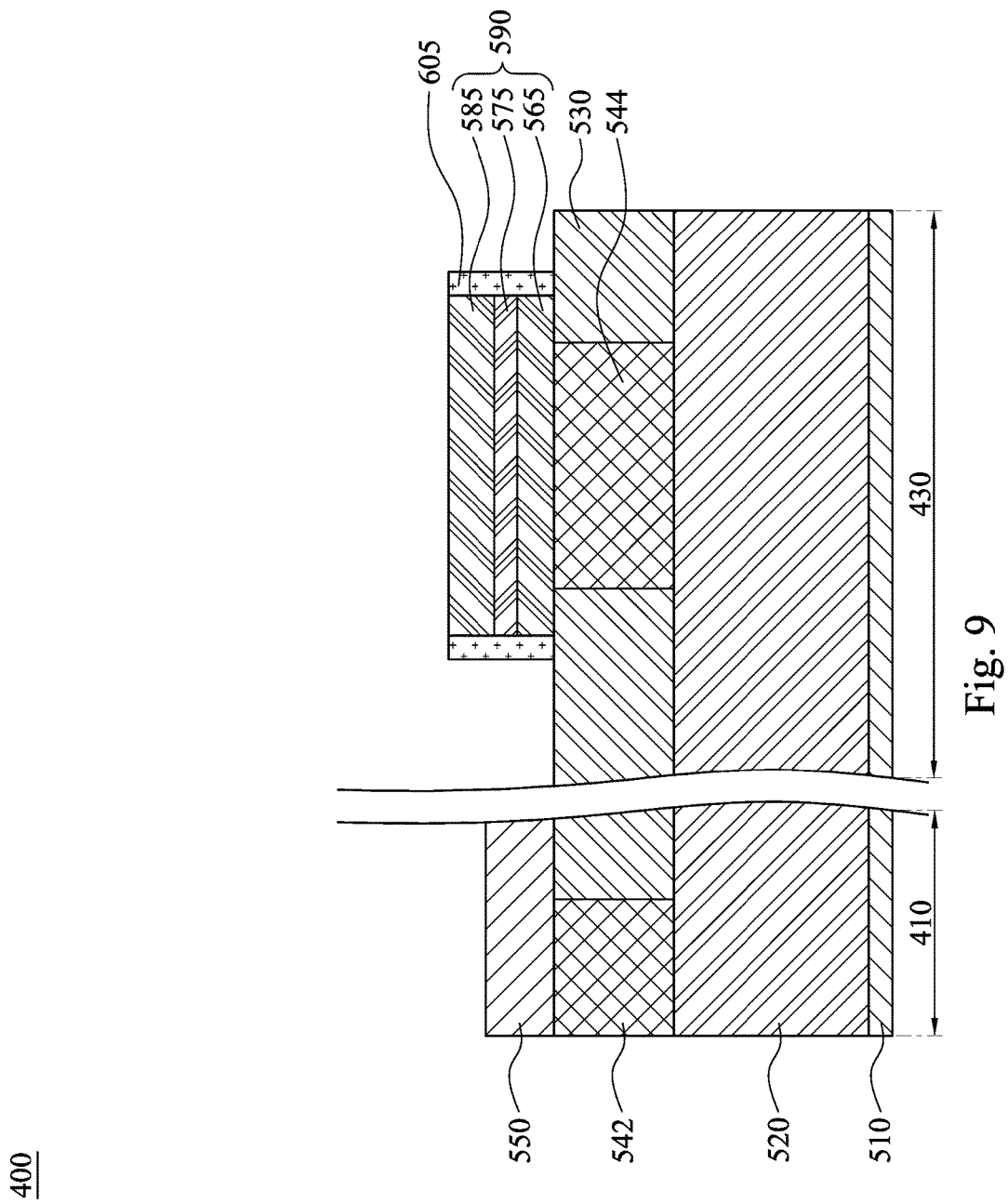

Next, as shown in FIG. 8, a spacer layer 600 is blanket formed over substrate 510 in the logic area 410 as well as the RRAM cell area 430. The spacer layer 600 conformally coats sidewalls of the MIM structure 590. The spacer layer 600 may include, for example, silicon nitride, silicon oxynitride, silicon oxide, other suitable dielectric materials, combinations thereof, or the like. Spacer is then etched to remove the field portions of the spacer layer 600, and the resulting structure is shown in FIG. 9. Because of the shape of the conformal deposition, the spacer layer 600 in the open regions such as the logic area 410 and over the top electrode 585 is removed during this etch. A small portion remains as a spacer 605 as shown in FIG. 9. The spacer 605 surrounds the MIM structure 590. A height and a width of the spacer 605 after etching may be tuned by adjusting deposition and etching parameters.

Figure 10:
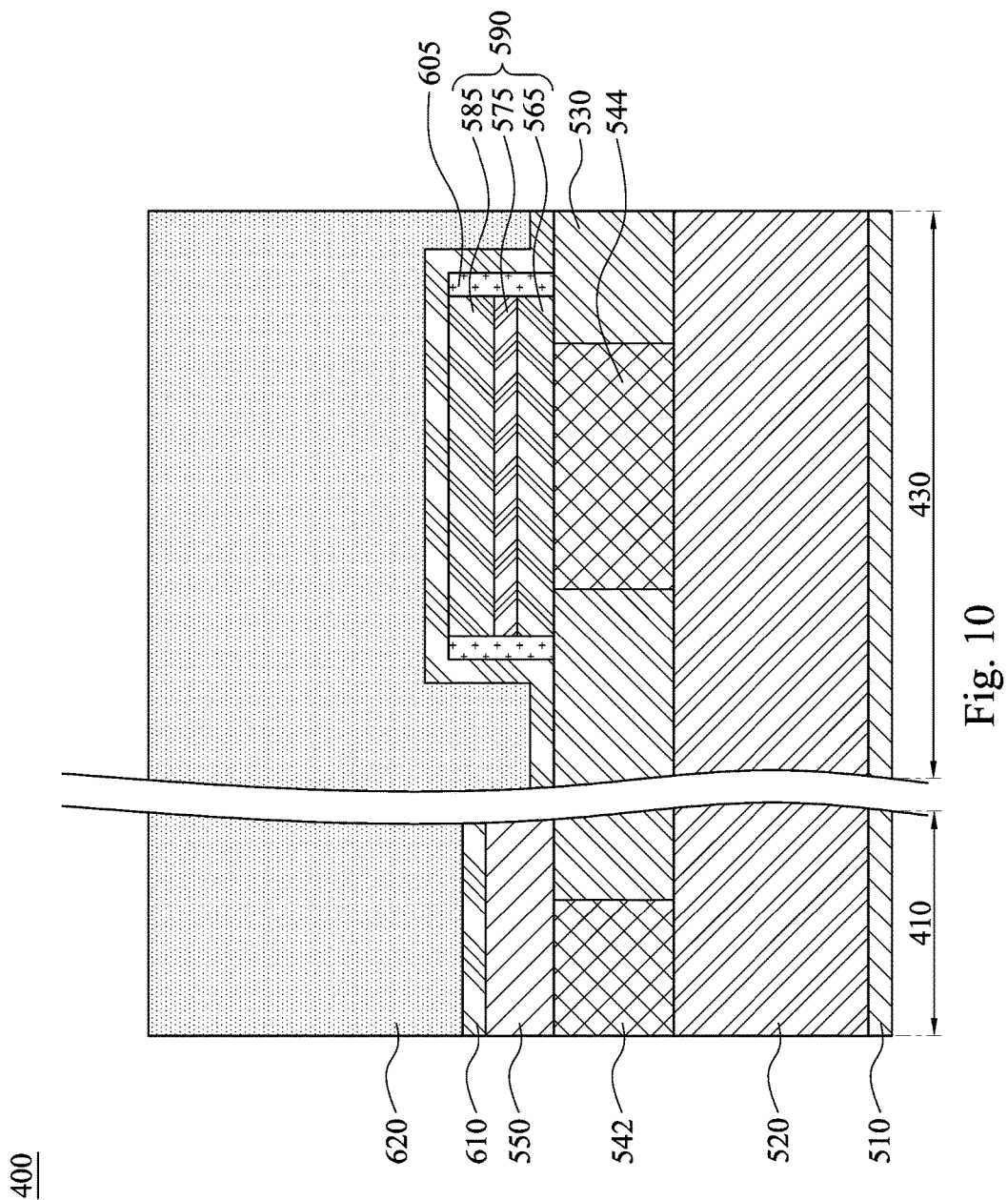

Reference is made to FIG. 10. A second stop layer 610 is blanket formed over the substrate 510. An IMD layer 620 is deposited over the second stop layer 610. The second stop layer 610 may include the same material as the first stop layer 550 in some embodiments. The second stop layer 610 may include silicon carbide, silicon oxynitride, silicon nitride, carbon doped silicon nitride, carbon doped silicon oxide, other suitable materials, combinations thereof, or the like. The material of the second stop layer 610 is selected to have a different etch selectivity than the overlying IMD layer 620. The second stop layer 610 is deposited conformally over the MIM structure 590 using a chemical vapor deposition (CVD) process such as plasma enhanced (PE) CVD, high-density plasma (HDP) CVD, inductively-coupled-plasma (ICP) CVD, thermal CVD, or the like.

The IMD layer 620 may include the same material as the IMD layer 530 in some embodiments. The IMD layer 620 may include, for example, silicon oxide, low-k silicon oxide such as a porous silicon oxide layer, other suitable dielectric material, combinations thereof, or the like. The IMD layer 620 is deposited in the area between the MIM structures 590 and covers the MIM structures 590. If the MIM structures 590 are separated by a short distance, aspect ratio of a gap between the MIM structures 590 may be undesirably high, and hence voids may be formed in the IMD layer 620 after the IMD layer 620 is deposited into the gap with undesirable high aspect ratio. However, since the step heights of the MIM structures 590 can be lowered by forming the MIM structures 590 not over the first stop layer 550, the aspect ratio of the gap between the MIM structures 590 can be lowered. Accordingly, reduction of step heights of MIM structures 590 may be advantageous for preventing voids formed in the IMD layer 620.

Figure 11:
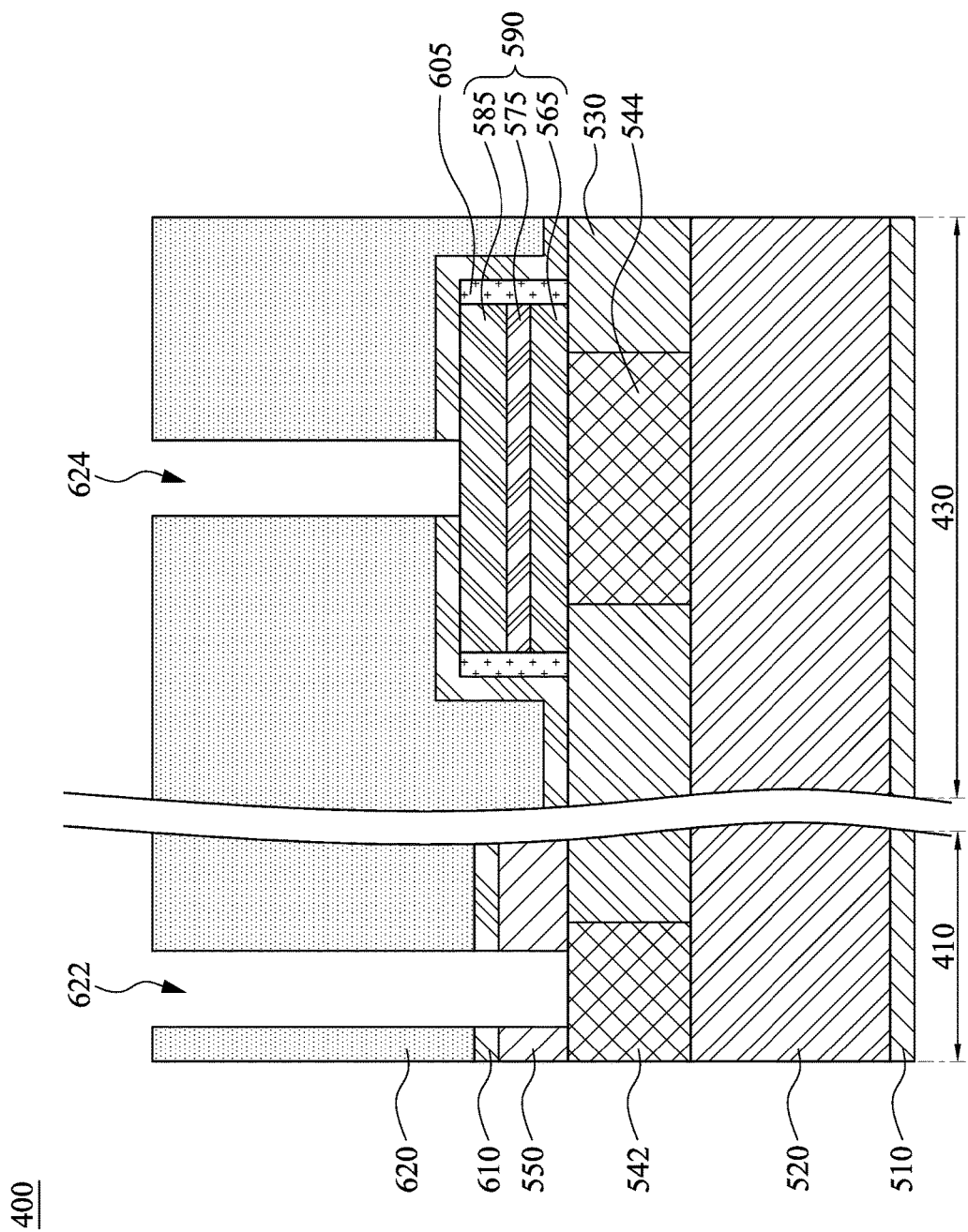

Reference is made in FIG. 11. A contact via 622 and a top electrode via 624 are formed in the IMD layer 620. The top electrode via 624 extends from a top surface of the IMD layer 620 to the top electrode 585 of the MIM structure 590. In some embodiments, formation of vias may be performed in multiple steps: in a first step, a first pattern and etch stops on top of the second stop layer 610 in the RRAM cell area 430 and in a second step, the second stop layer 610 is etched through to the top electrode 585 of the MIM structure 590. The subsequent step of etching through the second stop layer 610 may be performed together with contact etching in the logic area 410.

The contact via 622 is formed in the IMD layer 620 in the logic area 410. The contact via 622 extends from the top surface of the IMD layer 620 to the metal feature 542 below the first stop layer 550. A first pattern and etch stops on top of the first stop layer 550 and subsequently, the first stop layer 550 is etched through to the metal feature 542. The subsequent step of etching through the first stop layer 550 may be performed together with top electrode via 624 etching in the RRAM cell area 430.

In some embodiments, in the RRAM cell area 430, the top electrode via 624 is formed, with a small portion of the second stop layer 610 remaining at a bottom of the top electrode via 624. In the logic area 410, the contact via 622 is formed, with a small portion of the first stop layer 550 remaining at a bottom of the contact via 622. Because depths of the top electrode via 624 and the contact via 622 vary as well as the material composition etched, the top electrode etch and the contact via etch may be performed separately to ensure good process uniformity. To that end, two photomasks may be used, one for patterning the top electrode via and one for patterning the contact via. The remaining portion of the second stop layer 610 in the RRAM cell area 430 and the remaining portion of the first stop layer 550 in the logic area 410 may be removed at the same time to expose the top electrode 585 and metal feature 542.

Figure 12:
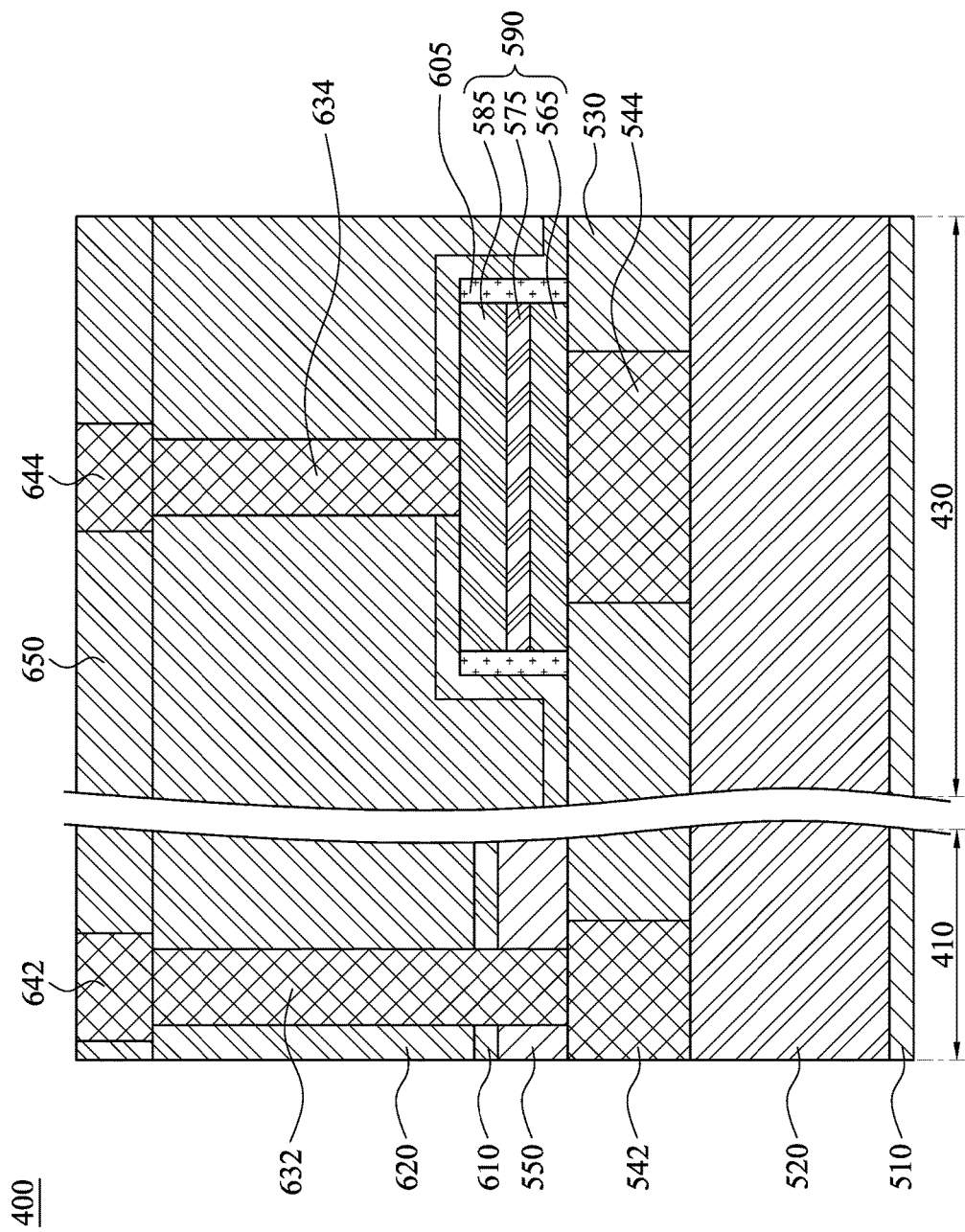

The contact via 622 and the top electrode via 624 are filled with a conductive material, usually a metal, to form a contact 632 and a top electrode contact 634, as shown in FIG. 12.

The filling may also include one or more liner and barrier layers in addition to a metal conductor. The liner and/or barrier may be conductive and deposited using CVD, PVD, or the like. The metal may be deposited using PVD, one of the plating methods, such as electrochemical plating, or the like.

Another IMD layer 650 with embedded metal features 642 and 644 may be formed over the IMD layer 620 in a similar way as the IMD layer 530 with the embedded metal features 542 and 544. In some embodiments, excess metal from the top electrode via 624 and the contact via 622 filling are removed by planarization, new dielectric material is deposited, metal line trenches are patterned and etched in the new dielectric material, and metal lines are filled to form the IMD layer 650 with embedded metal features 642 and 644. Because the step height of the MIM structure 590 is reduced by forming the MIM structure 590 not over the first stop layer 550, the CMP process window of the planarization for removing the excess metal can be improved. In some embodiments, the metal line trenches are patterned and etched before the top electrode via 624 and the contact via 622 are filled. When dimensions are such that the filling process permits, one filling operation can fill both the contacts and the metal trenches. In some embodiments, a combination of the IMD layers 620 and 650 may be IMD5, as depicted in FIGS. 1-3. In some embodiments, the metal features 642 and 644 may be the M5 layer, and the contact 632 may be the metallization via V5 extending below the M5 layer, as depicted in FIG. 1-3.

In some embodiments, a planarization process, such as a CMP process, may be performed to the M5 layer (i.e. metal features 642, 644). Because the step height of the MIM structure 590 is reduced by forming the MIM structure 590 not over the first stop layer 550, the CMP process window can be improved.

Various embodiments of the present disclosure have various following advantages. For instance, the stop layer extends over the IMD4 in the logic area and is separated from the MIM structure, and hence the step height of the MIM structure is reduced. This reduction of step height can lower aspect ratio of a gap between MIM structures to an acceptable level, and therefore, formation of voids in IMD5 can be prevented when IMD5 is deposited into the gap with acceptable aspect ratio. Moreover, the reduction of step height is also advantageous to improve CMP process window for planarizing layers over the MIM structure, such as the M5 layer and/or IMD5.

In accordance with some embodiments, a semiconductor device includes an inter-metal dielectric layer, a memory cell, a transistor and a dielectric layer. The memory cell includes a metal-insulator-metal (MIM) structure over a top surface of the inter-metal dielectric layer. The transistor underlies the inter-metal dielectric layer. The dielectric layer extends over the transistor and along the top surface of the inter-metal dielectric layer. The dielectric layer is separated from the MIM structure.

In accordance with some embodiments, a semiconductor device includes an inter-metal dielectric layer, a dielectric layer, a transistor and a memory cell. The dielectric layer covers a first portion of the inter-metal dielectric layer and does not cover a second portion of the inter-metal dielectric layer. The transistor is covered by the first portion of the inter-metal dielectric layer. The memory cell includes a metal-insulator-metal (MIM) structure over the second portion of the inter-metal dielectric layer.

In accordance with some embodiments, a method of forming a metal-insulator-metal (MIM) structure of a memory cell includes forming an inter-metal dielectric layer with an embedded metal feature over a substrate, forming a stop layer over the inter-metal dielectric layer, removing a portion of the stop layer such that the embedded metal feature and a portion of the inter-metal dielectric layer are exposed, forming in sequence a bottom electrode layer, an dielectric layer, and a top electrode layer over the exposed embedded metal feature and the exposed portion of inter-metal dielectric layer, and patterning the bottom electrode layer, the dielectric layer, and the top electrode layer to form the MIM structure of the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an inter-metal dielectric layer;
   a memory cell comprising a metal-insulator-metal (MIM) structure over a top surface of the inter-metal dielectric layer;
   a transistor underlying the inter-metal dielectric layer;
   a dielectric layer extending over the transistor and along the top surface of the inter-metal dielectric layer, the dielectric layer being separated from the MIM structure; and
   a metal feature having a top surface substantially flush with the top surface of the inter-metal dielectric layer, wherein the MIM structure interfaces the top surface of the metal feature and the dielectric layer is absent on the top surface of the metal feature.

2. The semiconductor device of claim 1, wherein the MIM structure is in contact with the top surface of the inter-metal dielectric layer.

3. The semiconductor device of claim 1,
   wherein the dielectric layer is separated from the metal feature.

4. The semiconductor device of claim 1,
   wherein the MIM structure interfaces the top surface of the inter-metal dielectric layer.

5. The semiconductor device of claim 1, wherein the dielectric layer and the MIM structure have different etch properties.

6. The semiconductor device of claim 1, further comprising a stop layer over the dielectric layer.

7. The semiconductor device of claim 1, further comprising a stop layer over the MIM structure.

8. The semiconductor device of claim 1, wherein the MIM structure comprises a plurality of layers stacked over the inter-metal dielectric layer, wherein a bottom one of the layers has a top surface in a position lower than a top surface of the dielectric layer.

9. The semiconductor device of claim 8, wherein the layers of the MIM structure comprise sidewalls substantially flush with each other.

10. The semiconductor device of claim 8, further comprising:

a spacer abutting sidewalls of the layers of the MIM structure.

11. The semiconductor device of claim 10, wherein the spacer is in contact with the top surface of the inter-metal dielectric layer.

12. A semiconductor device, comprising:
an inter-metal dielectric layer;
a dielectric layer covering a first portion of the inter-metal dielectric layer and not covering a second portion of the inter-metal dielectric layer;
a transistor covered by the first portion of the inter-metal dielectric layer;
a memory cell comprising a metal-insulator-metal (MIM) structure over the second portion of the inter-metal dielectric layer; and
a spacer on a sidewall of the MIM structure and separated from the dielectric layer.

13. The semiconductor device of claim 12, wherein the MIM structure interfaces the second portion of the inter-metal dielectric layer.

14. The semiconductor device of claim 12, wherein the MIM structure comprises a bottom electrode layer, an insulator layer, and a top electrode layer stacked in sequence, wherein a top surface of the bottom electrode layer is lower than a top surface of the dielectric layer.

15. The semiconductor device of claim 12, further comprising:
a metal feature embedded in the inter-metal dielectric layer, wherein the MIM structure is in contact with the metal feature and the inter-metal dielectric layer.

16. A method of forming a metal-insulator-metal (MIM) structure of a memory cell, comprising:

forming an inter-metal dielectric layer with an embedded metal feature over a substrate;
forming a stop layer over the inter-metal dielectric layer;
removing a portion of the stop layer such that the embedded metal feature and a portion of the inter-metal dielectric layer are exposed;
forming in sequence a bottom electrode layer, an dielectric layer, and a top electrode layer over the exposed embedded metal feature and the exposed portion of the inter-metal dielectric layer; and
patterning the bottom electrode layer, the dielectric layer, and the top electrode layer to form the MIM structure of the memory cell.

17. The method of claim 16, further comprising:
forming a transistor on the substrate, wherein the inter-metal dielectric layer and the stop layer are formed over the transistor, and wherein after the removing the portion of the stop layer, another portion of the stop layer over the transistor remains.

18. The method of claim 16, wherein the forming the bottom electrode layer comprises forming the bottom electrode layer conformally along top surfaces of the exposed embedded metal feature and the exposed portion of the inter-metal dielectric layer.

19. The method of claim 16, wherein the patterning the bottom electrode layer forms a bottom electrode in contact with the exposed portion of the inter-metal dielectric layer.

20. The method of claim 16, further comprising:
forming a spacer along sidewalls of the patterned top electrode layer, dielectric layer, and bottom electrode layer to reach the inter-metal dielectric layer.

* * * * *